(12) United States Patent  
Lamicq

(10) Patent No.: US 10,360,326 B2
(45) Date of Patent: Jul. 23, 2019

(54) METHOD FOR DETERMINING VIBRATORY CONTACT STRESS AT A BLADE ATTACHMENT

(71) Applicant: SOLAR TURBINES INCORPORATED, San Diego, CA (US)

(72) Inventor: Olivier Lamicq, San Diego, CA (US)

(73) Assignee: Solar Turbines Incorporated, San Diego, CA (US)

( * ) Notice: Subject to any disclaimer, the term of this patent is extended or adjusted under 35 U.S.C. 154(b) by 509 days.

(21) Appl. No.: 15/157,969

(22) Filed: May 18, 2016

(65) Prior Publication Data

US 2017/0337306 A1 Nov. 23, 2017

(51) Int. Cl.
*F01D 5/10* (2006.01)
*G06F 17/50* (2006.01)
*F01D 5/16* (2006.01)
*F01D 5/30* (2006.01)
*F04D 29/26* (2006.01)

(52) U.S. Cl.
CPC ........... *G06F 17/5018* (2013.01); *F01D 5/10* (2013.01); *F01D 5/16* (2013.01); *F01D 5/3007* (2013.01); *F04D 29/26* (2013.01); *F05D 2260/81* (2013.01)

(58) Field of Classification Search
CPC .......... G06F 17/5018; F01D 5/10; F01D 5/16; F01D 5/3007; F04D 29/26; F05D 2260/81
See application file for complete search history.

(56) References Cited

U.S. PATENT DOCUMENTS

| | | | | |
|---|---|---|---|---|
| 7,082,371 B2 * | 7/2006 | Griffin | | G01H 1/006 702/10 |
| 7,206,709 B2 * | 4/2007 | Griffin | | G01H 1/006 702/85 |
| 2002/0083772 A1 * | 7/2002 | Sonnichsen | | G01H 1/006 73/660 |
| 2011/0274537 A1 * | 11/2011 | Duong | | F01D 9/045 415/182.1 |
| 2013/0110476 A1 * | 5/2013 | Delvaux | | G01M 7/00 703/2 |
| 2015/0285613 A1 * | 10/2015 | Kilpatrick | | G01B 11/14 356/477 |
| 2016/0178345 A1 * | 6/2016 | Kilpatrick | | G01P 3/36 356/482 |

* cited by examiner

*Primary Examiner* — S. Sough
*Assistant Examiner* — Kimberly L Jordan
(74) *Attorney, Agent, or Firm* — Finnegan, Henderson, Farabow, Garrett & Dunner, LLP

(57) ABSTRACT

A modal analysis is performed on a blade and disk assembly of a turbomachine, including selecting a target vibration frequency at which a target amplitude of vibration has been measured for a target node during operation, and deriving modal velocity vectors from the target amplitude at the target node. A transient analysis is performed on a numerical model of the blade and disk assembly, including modeling the connection between the blade and disk such that the connection is characterized by a first degree of flexibility representative of a first set of actual operating conditions at the connection, and introducing a perturbation to the transient analysis at an initial steady state condition by applying the modal velocity vectors suddenly to a plurality of nodes of the numerical model while maintaining the initial steady state condition.

20 Claims, 4 Drawing Sheets

US 10,360,326 B2

METHOD FOR DETERMINING VIBRATORY CONTACT STRESS AT A BLADE ATTACHMENT

TECHNICAL FIELD

The present disclosure is directed to a method for determining vibratory contact stress and, more particularly, a method for determining vibratory contact stress at a blade attachment.

BACKGROUND

Many computer-based applications exist for aiding in the design of products. Using these applications, an engineer can construct a computer model of a particular product and can analyze the behavior of the product through various analysis techniques. Further, certain analytical tools have been developed that enable engineers to evaluate and test multiple design configurations of a product.

For example, a blade and disk assembly may be modeled for design purposes. The blade and disk assembly may be initially modeled with certain simplifying assumptions made, such as the assumption that the connection between the blade and the disk is a rigid connection with no flexibility. An analytical tool, such as, for example, a finite element analysis (FEA) application, may test design configurations of the blade and disk assembly, and for the interconnection at the blade root, against requirements relating to stress and strain, vibration response, modal frequencies, and stability to predict the failure and fatigue life of the assembly in terms of specific design parameters. The data from the analytical tool may then be used to provide insight on how specific design parameters of the assembly can be modified to increase the fatigue life of the various components.

A blade used in turbomachinery is subject to significant sources of vibrations, which can lead to failure. Numerical models using modal analysis are traditionally used to evaluate the propensity of a blade to fail in vibration. Modal analysis is quick and efficient, but has the disadvantage of over-simplifying the connection between the blade and the disk. As a result, the numerical results derived from modal analysis, such as harmonic response and related techniques, are of limited usefulness for areas at or near the connection between the blade and the disk. Analyzing or predicting the modes of failure encountered at or near the blade root, such as wear, fretting, cracks due to high cycle fatigue, etc., requires a different approach that establishes a model in the time domain, and applies transient analysis. A traditional approach for transient analysis would apply a theoretical or actual forcing function to the blade, and then simulate many cycles until the vibration reaches a steady-state regime. The behavior inside the contact area at the blade root could then be analyzed.

Several drawbacks result from the traditional approach. For example, the classical approach to transient analysis, including simulating many cycles until the vibration reaches a steady-state regime, is extremely computer intensive. The forcing function to be applied to the blade is also typically of such complexity that it needs to be either simplified or idealized. Another problem is that the non-linear nature of behavior at the connection between the blade and the disk may introduce unintended frequency content into the response, preventing the emergence of a steady-state condition and complicating any interpretation of the results of the transient analysis.

The method of the present disclosure is directed towards improvements to existing technology.

SUMMARY OF THE DISCLOSURE

One aspect of the present disclosure may be directed to a computer-implemented method for determining stresses at the connection between a blade and a disk in a blade and disk assembly of a turbomachine. The method may include performing a modal analysis on the blade and disk assembly, wherein the modal analysis includes creating a finite element model of the blade and disk assembly made up of a plurality of nodes corresponding to points on the blade and disk assembly and characterized by a simplifying assumption of a rigidly attached connection between the blade and disk. The method may further include selecting a target vibration frequency at which a target amplitude of vibration has been one of measured or estimated for a target node on the blade and disk assembly of the turbomachine during operation, and deriving modal velocity vectors from the target amplitude at the target node. The method may still further include performing a transient analysis in a time domain on a numerical model of the blade and disk assembly, wherein the transient analysis includes modeling the connection between the blade and disk such that the connection is characterized by a first degree of flexibility representative of a first set of actual operating conditions at the connection, and running the transient analysis to an initial steady state condition. A perturbation may then be introduced to the transient analysis at the initial steady state condition by applying the modal velocity vectors suddenly to a plurality of nodes of the numerical model of the blade and disk assembly while maintaining the initial steady state condition.

Another aspect of the present disclosure may be directed to a method of modeling the connection between a blade and disk at a root connection between the blade and disk. The method may include performing a modal analysis on the blade and disk assembly, wherein the modal analysis includes creating a finite element model of the blade and disk assembly assuming a fully rigidly attached connection between the blade and disk. The method may further include selecting a first target vibration frequency at which a first target amplitude of vibration has been measured at a target node on a blade and disk assembly of a particular turbomachine during operation, and deriving modal velocity vectors from the first target amplitude at the target node. The method may still further include performing a transient analysis in a time domain on a numerical model of the blade and disk assembly, wherein the transient analysis includes modeling the connection between the blade and disk such that the connection is characterized by a degree of flexibility representative of a first set of actual operating conditions for the particular turbomachine at the connection, and running the transient analysis to an initial steady state condition. A perturbation may be introduced to the transient analysis at the steady state condition without applying a forcing function to the blade or disk by applying the modal velocity vectors from the first target amplitude of vibration suddenly to a plurality of nodes of the numerical model of the blade and disk assembly while maintaining the steady state condition.

Still another aspect of the present disclosure may be directed to a non-transitory computer-readable medium for use in determining at least one of behavior and characteristics of a connection between a blade and a disk in a blade and disk assembly of a turbomachine. The computer-readable medium may include computer-executable instructions that, when executed by one or more computer processors, perform a method comprising performing a modal analysis on the blade and disk assembly, wherein the modal analysis includes creating a finite element model of the blade and disk assembly made up of a plurality of nodes corresponding to points on the blade and disk assembly and characterized by a simplifying assumption of a rigidly attached connection between the blade and disk. The modal analysis may also include selecting a target vibration frequency at which a target amplitude of vibration has been one of measured or estimated for a target node on the blade and disk assembly of the turbomachine during operation, and deriving modal velocity vectors from the target amplitude at the target node. The method may also include performing a transient analysis in a time domain on a numerical model of the blade and disk assembly, wherein the transient analysis includes modeling the connection between the blade and disk such that the connection is characterized by a first degree of flexibility representative of a first set of actual operating conditions at the connection. The transient analysis may be run to an initial steady state condition, and then a perturbation may be introduced to the transient analysis at the initial steady state condition by applying the modal velocity vectors suddenly to a plurality of nodes of the numerical model of the blade and disk assembly while maintaining the initial steady state condition.

DETAILED DESCRIPTION

Figure 1:
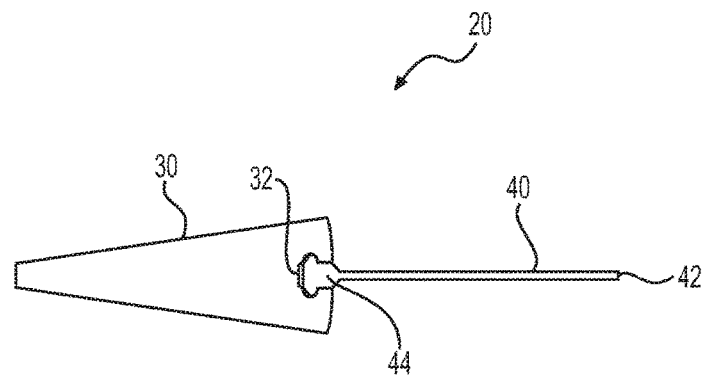
FIG. 1 is a diagrammatic model of a blade and disk assembly according to an exemplary disclosed embodiment.

FIG. 1 illustrates a sector of a blade disk with a blade connected to the disk sector at a dove-tail type root connection. One of ordinary skill in the art will recognize that the dove-tail type root connection between the blade and the disk is illustrative of only one possible connection configuration. Alternative configurations of the connection between each blade and disk may include fir-tree type root connections and other root connections with different configurations and dimensions.

Blade vibration is generally recognized as one of the most significant causes of high cycle fatigue failure in gas turbine engines and other turbomachines. The blade root flexibility often cannot be determined easily in the assessment of blade vibration behavior, and exclusion of this effect may lead to a false prediction of vibration characteristics. Vibration characteristics of a blade and disk assembly may be determined through 3-D finite element analysis, together with laboratory or test-stand testing of an engine or other turbomachine containing the blade and disk assembly. The vibration characteristics of the blade may be analyzed and the predicted results may be correlated with laboratory or test-stand test results at ambient temperature. Various sensors, including vibration sensors, proximity sensors, optical probes, photo detectors, displacement sensors, and field-type sensors such as eddy current, capacitive, and microwave sensors may be provided throughout or external to the engine, including at different points along or adjacent to each blade and disk, and at the root connection between each blade and disk in order to produce signals indicative of a target vibration frequency, and a target amplitude of vibration at each of a plurality of target nodes on the blade and disk assembly. The vibration characteristics of the blade assembly during engine operation, and in particular the vibration characteristics at the connection between the blade and the disk, may be predicted in accordance with various implementations of this disclosure using a combination of traditional modal analysis and an expedited form of transient analysis.

Figure 2:
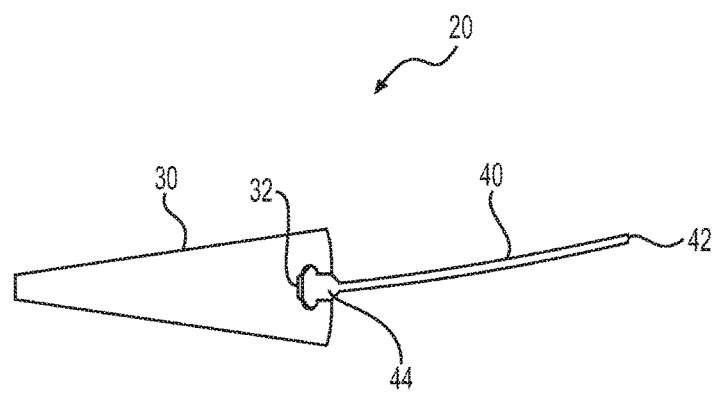
FIG. 2 is a diagrammatic representation of the blade and disk assembly of FIG. 1 in a steady-state position with the blade bent by a combination of centrifugal load and gas loads.
Figure 3:
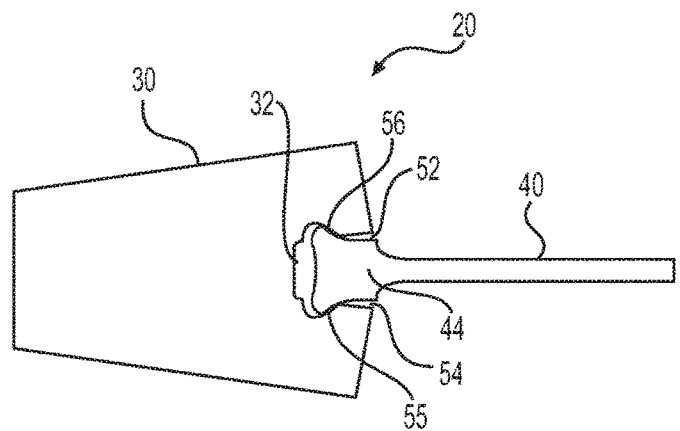
FIG. 3 is an enlarged diagrammatic representation of the blade and disk assembly of FIG. 1, illustrating a degree of flexibility at the connection.

The contact between the blade root and the disk is traditionally simplified into a linear or quasi-linear model. An example of the blade and disk assembly of FIG. 1 in a steady-state position with the blade bent by a combination of centrifugal loads and gas loads is shown in FIG. 2. The analytically indeterminate interactions between the blade and disk root connections may be simplified in order to achieve a linear model required for modal analysis. In practice, the connection stiffness between the blade and disc connections may be dependent upon a combination of the root geometry, materials, and the contact conditions during engine operation subject to both centrifugal, pressure, and temperature loads. Hence, the root flexibility of a blade in service may differ substantially from either the fully rigidly attached condition or the flexible support condition. In the exemplary representation of a blade and disk assembly shown in FIG. 3, a degree of flexibility at the root connection between the blade 40 and the disk 30 may be caused at least partially by the configuration of the root connection, including the configuration of a disk root connection interface 32 and a blade root connection interface 44. Contact areas 55 and 56 are shown closed and in full contact under load, but may open partially or fully depending on the relative deformation of the disk and blade root. In the exemplary representation shown in FIG. 3, gaps 52, 54 may exist between the disk root connection interface 32 and the blade root connection interface 44. These gaps, along with other surface characteristics and anomalies that may affect the disk/blade interface, such as the presence of lubricants or impurities, can have a significant effect on the root connection stresses, contact status, stick-slip motion between the blade and disk, relative movement of the surfaces, fatigue, failure potential, and other characteristics.

In various exemplary implementations of this disclosure, a blade and disk design and/or analysis system may include one or more processors configured for determining stresses at the connection between a blade and a disk in a blade and disk assembly of a turbomachine. The one or more processors may include any appropriate type of general purpose microprocessor, digital signal processor, or microcontroller. Memory modules associated with the one or more processors may include one or more memory devices. The memory devices may include a ROM, a flash memory, a dynamic RAM, and a static RAM. Memory modules may be configured to store information accessed and used by the one or more processors. One or more databases associated with the one or more processors may include any type of appropriate database containing information relating to characteristics of input parameters, output parameters, mathematical models, and/or any other control information. In addition, an input/output (I/O) interface may be connected to various data input devices (e.g., keyboards, pointers, drawing tablets, etc.) to provide data and control information supplied to and received from the blade and disk assembly design system. A network interface may also be provided and may include any appropriate type of network adaptor capable of communicating with other computer systems based on one or more communication protocols. A display or other user interface may include any type of device (e.g., CRT monitors, LCD screens, etc.) capable of graphically depicting information and/or conveying the results of analysis of a blade and disk assembly.

The one or more processors of the blade and disk assembly design and/or analysis system in accordance with various implementations of this disclosure may be configured to perform a series of method steps that conduct a modal analysis, and use results from the modal analysis as inputs to an expedited transient analysis. The one or more processors may be configured to provide an expedited, computer-resource efficient, and reliable analysis of various behaviors, stresses, and other conditions at the root connections between the blades and disks. Alternatively or in addition, a non-transitory computer-readable medium in accordance with various exemplary implementations of this disclosure may be provided for use in determining at least one of behavior and characteristics of a connection between a blade and a disk in a blade and disk assembly of a turbomachine. The computer-readable medium may be configured to include computer-executable instructions that, when executed by the one or more computer processors, perform a method that includes conducting a modal analysis with some simplifying assumptions about the root connection interface, and using results from the modal analysis as inputs to a transient analysis of the blade and disk assembly.

The one or more processors may be configured to perform the modal analysis on the blade and disk assembly, wherein the modal analysis includes creating a finite element model (FEM) of the blade and disk assembly made up of a plurality of nodes corresponding to points on the blade and disk assembly. The FEM may be characterized by a simplifying assumption of a rigidly attached connection between the blade and disk. The one or more processors may be further configured to receive and/or select from a database a target vibration frequency at which a target amplitude of vibration has been one of measured or estimated for a target node on the blade and disk assembly of the turbomachine during operation. The target vibration frequency (F) and target amplitude of vibration ($A_{TARGET}$) may have been previously determined during laboratory tests on an engine or while operating the engine on a test stand that is part of a Non-Intrusive Stress Measurement System (NSMS). Alternatively or in addition, the target vibration frequency and target amplitude of vibration may be the result of theoretical calculations, estimates based on past measurements or anticipated values, or arbitrarily chosen values. The NSMS provides a method of determining dynamic blade stresses in rotating turbomachinery. NSMS may use internally and/or externally mounted sensors to determine the passing times of turbomachinery blades. The passing times after conversion to deflections, can be used to measure each blade's vibratory response characteristics such as amplitude, stress, phase, frequency, and damping. Since every blade is measured, stage effects such as flutter, blade mistuning, and nodal diameter can also be characterized. The measurement methods of the NSMS may be used in all stages of a gas turbine engine and other turbomachinery equipment ranging from turbo chargers to rocket pumps, including in the fan section, the compressor section, and the turbine section.

A target amplitude of vibration at a chosen node may be received by the one or more processors from the NSMS or from a database storing information previously derived from testing a particular engine or other turbomachinery. The processors may be configured to perform the modal analysis and capture modal displacement vectors for all nodes of interest in the FEM of the blade and disk assembly. The target amplitude of vibration at the chosen node selected by the processors may be used by the processors to determine a ratio of target amplitude of vibration at a target node to the modal displacement of that target node. The processors may be still further configured to derive modal velocity vectors for all nodes of the FEM using the ratio and the target vibration frequency F (e.g., a velocity vector in the X direction at a node may be calculated as $\dot{X}=RATIO*X*2\pi F$).

Figure 4:
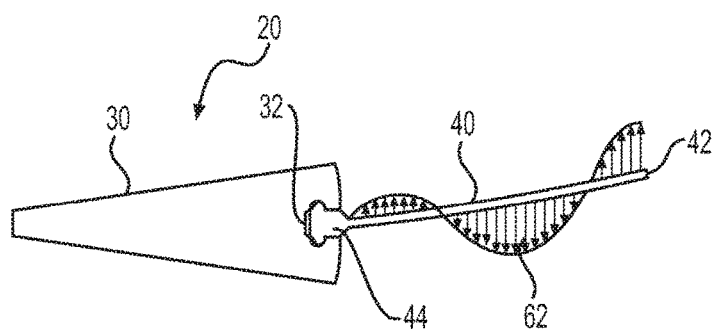
FIG. 4 is a diagrammatic representation of the blade and disk assembly of FIG. 1 in a steady-state position with the introduction of a perturbation in the form of modal velocity vectors at a plurality of nodes.

The one or more processors may be further configured to perform a transient analysis in a time domain on a numerical or finite element model of the blade and disk assembly. The transient analysis may include modeling the root connection between the blade and disk such that the connection is characterized by a first degree of flexibility representative of a first set of actual operating conditions at the connection. The model used in the transient analysis may account for a particular set of operating conditions at the connection between a blade and a disk. The operating conditions may include physics-derived theoretical assumptions and/or empirically derived data obtained from at least one of destructive laboratory testing and non-destructive testing such as performed by the NSMS. The processors may be configured to run the transient analysis to an initial steady state condition. Upon reaching the initial steady state condition, the processors may be configured to introduce a perturbation to the transient analysis at the initial steady state condition. The perturbation may be introduced by applying the modal velocity vectors derived during the modal analysis with the simplifying assumption of a rigidly attached root connection interface. The application of the modal velocity vectors to a blade loaded in an initial steady state condition is in contrast to traditional approaches for performing transient analysis. Traditional approaches of performing transient analysis of a blade/disk interface have required the application of a forcing function to the blade, and then simulation of many cycles until the vibration reaches a steady state regime. Instead, the one or more processors in accordance with various embodiments of this disclosure may be configured to suddenly apply the modal velocity vectors without the prior application of a forcing function to a plurality of nodes of the numerical model of the blade and disk assembly while maintaining the initial steady state condition. Sudden application of the modal velocity vectors refers to application of the modal velocity vectors in a period of time that is less than 10 percent of the time for one cycle of the target vibration frequency. This approach enables the one or more processors to use far less computing resources than with traditional transient analysis. As shown in FIG. 4, modal velocity vectors 62 may be introduced by the processors configured in accordance with the present disclosure on all nodes of the numerical model of the blade and disk assembly with the blade already loaded in a steady state position.

Figure 6:
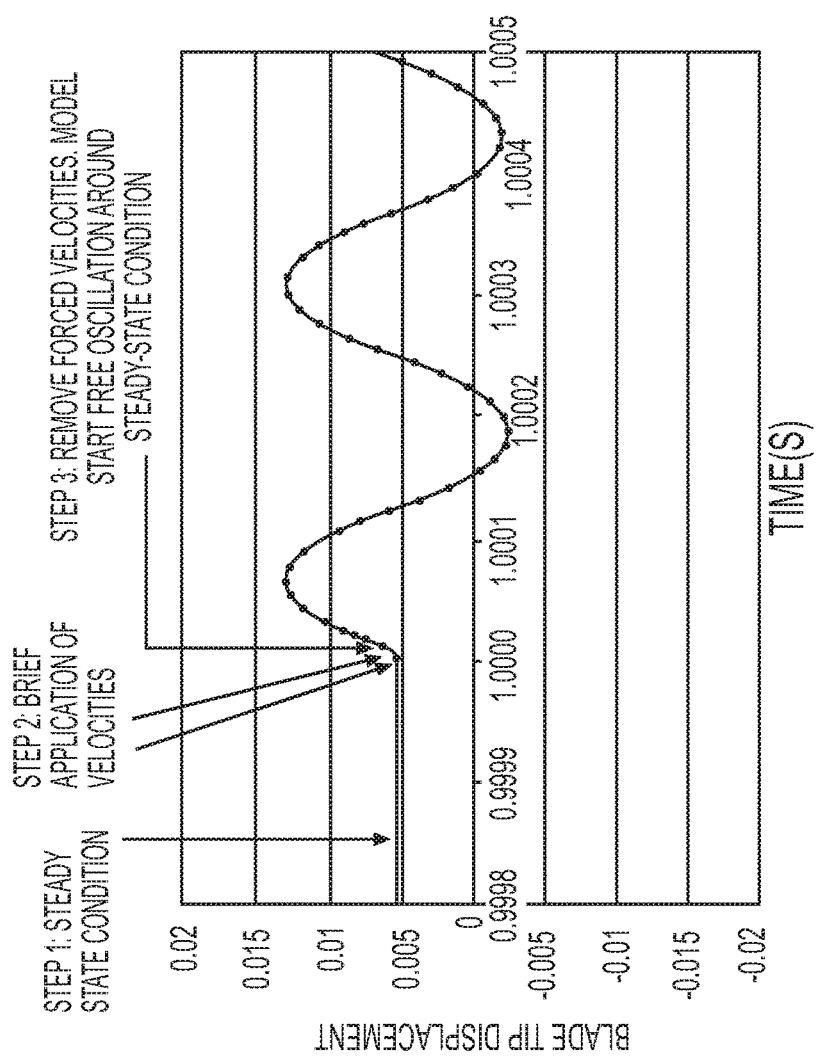
FIG. 6 is a graph illustrating a blade tip displacement over time at a steady-state condition and after application and removal of a perturbation.
Figure 5:
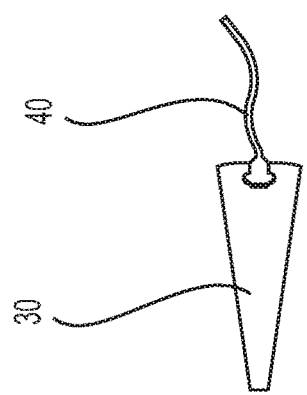
FIG. 5 is a diagrammatic representation of the blade and disk assembly of FIG. 4 immediately after removal of the perturbation.

The processors configured in accordance with the various implementations of this disclosure may also remove the perturbation while maintaining the initial steady state condition, and then analyze the transient response of the numerical model of the blade and disk assembly for a plurality of vibration cycles at the target vibration frequency after removal of the perturbation. As illustrated in FIG. 5, removal of the perturbation in the form of the modal velocity vectors 62 shown in FIG. 4 results in the blade 40 vibrating in a complex mode shape around the steady state position shown in FIG. 3. FIG. 6 illustrates a graph of blade tip displacement vs. time for an exemplary implementation wherein the processors are configured to impose an initial steady state load on the blade tip of approximately 0.006 inch (or other unit of measurement) and then superimpose on top of that initial steady state load the modal velocity vectors 62, resulting in a free oscillation of the blade around the steady state condition. The processors may be configured to perform an independent modal analysis and an independent transient analysis for each one of a different modal shape of the blade and disk assembly, for each one of a different target vibration frequency, for each one of a different target amplitude of vibration, and for each different degree of flexibility characterizing the connection and representative of a different set of actual operating conditions at the connection.

Additional features of the one or more processors configured in accordance with various embodiments of this disclosure may include the ability to further analyze vibration results after removal of the perturbation. The processors may be configured to at least one of verify amplitude at the target vibration frequency, determine time dependent structural stresses at the target node, determine the status of the connection between the blade and disk, determine stick-slip motion at the connection, determine relative motion between the blade and disk at the connection, determine fatigue at the connection, and determine a failure potential for the connection.

In contrast to traditional methods of performing transient analysis, the processors configured in accordance with various embodiments of this disclosure may apply the modal velocity vectors suddenly to a plurality of nodes rather than requiring the buildup of motion of the blade over many cycles after application of a theoretical forcing function. This feature of the processors configured in accordance with this disclosure enables advancement of the transient analysis suddenly from the initial steady state condition to a condition in which the nodes are represented as moving at the actual speeds the nodes would have to reach a point of maximum amplitude for a target vibration frequency of the blade and disk assembly. The processors thereby avoid the necessity of determining an initial forcing function to be applied to the assembly, which is typically of such complexity that it needs to be either simplified or idealized. Moreover, application of the modal velocity vectors to simulate maximum amplitude of the nodes avoids unintended frequency content in the response of the blade/disk assembly that may result from the non-linear and indeterminate nature of the actual connection between the blade and disk. The non-linear nature of a typical connection between a blade and disk may result in unintended frequency content in the response of the blade/disk assembly to a traditional forcing function and buildup of motion of the blade over many cycles. This may also prevent a stable vibratory condition from ever emerging under traditional transient analysis, and greatly complicate the interpretation of results with respect to a flexible connection between the blade and the disk.

The target vibration frequency at which a target amplitude of vibration has been one of measured or estimated for a target node on the blade and disk assembly of a particular turbomachine during operation is a result of a combination of centrifugal loads and gas loads on the blade and disk assembly during operation of the turbomachine. The processors in accordance with this disclosure may be configured to introducing the perturbation to the transient analysis in the initial steady state condition in the form of modal velocity vectors 62, as shown in FIG. 4. This feature of the processors results in a sudden simulation of the target amplitude of vibration without recreating amplitudes of vibration in between the initial steady state condition and the target amplitude that are not of interest. The sudden simulation of the target amplitude of vibration may occur in less than 10 percent of the time required for completion of one cycle of the target vibration frequency. The processors may be further configured to produce a numerical model of the transient analysis that demonstrates a free oscillation around the initial steady state condition immediately after removal of the perturbation, as illustrated in FIGS. 5 and 6. The free oscillation is characterized by the target vibration frequency and the target amplitude of vibration and is imposed on the connection between the blade and disk including the modeled degree of flexibility.

The one or more processors in accordance with various embodiments of this disclosure may be configured to determine the initial steady state condition of the transient analysis based on a number of different assumptions. These assumptions may include at least one of speed of the blade and disk assembly, a degree of flexibility characterizing the connection and representative of a particular set of operating conditions at the connection, temperature at the connection, pressure of gases flowing past the blade and disk assembly, a physical characteristic of the gases, and a physical configuration and relative dimensions of portions of the blade and disk at the connection therebetween.

The processors in accordance with various embodiments of this disclosure may be configured to model the connection between a blade and disk as a fir-tree root connection, a dove-tail root connection, or other shaped root connection between the blade and disk. As described above, the processors may be configured to perform the modal analysis on the blade and disk assembly, in which the modal analysis includes creating a finite element model (FEM) of the blade and disk assembly assuming a fully rigidly attached connection between the blade and disk. The processors may be further configured to select a first target vibration frequency at which a first target amplitude of vibration has been measured at a target node on a blade and disk assembly of a particular turbomachine during operation. The processors may be configured to derive modal velocity vectors from the first target amplitude at the target node. The processors in accordance with this disclosure may also be configured to perform a transient analysis in a time domain on a numerical model of the blade and disk assembly, wherein the transient analysis includes modeling the connection between the blade and disk such that the connection is characterized by a degree of flexibility representative of a first set of actual operating conditions for the particular turbomachine at the connection. The same transient analysis can be performed by the processors for different amplitudes of vibration to identify step changes in the behavior of the root connection.

The processors may be configured to introduce a perturbation to the transient analysis at the steady state condition without applying a forcing function to the blade or disk by applying the modal velocity vectors from the first target amplitude of vibration suddenly to a plurality of nodes of the numerical model of the blade and disk assembly while maintaining the steady state condition. After selection of the first target vibration frequency, the processors may be configured to select a second target vibration frequency at which a second target amplitude of vibration different from the first amplitude of vibration has been measured at a target node on a blade and disk assembly of a particular turbomachine during operation. Modal velocity vectors may be derived from the second target amplitude at the target node. The processors may be configured to perform the transient analysis in a time domain on a numerical model of the blade and disk assembly, wherein the transient analysis includes modeling the connection between the blade and disk such that the connection is characterized by a degree of flexibility representative of the first set of actual operating conditions for the particular turbomachine at the connection. The transient analysis may be run only to an initial steady state condition, at which point the processors may be configured to receive input from the modal analysis. The processors may then introduce a perturbation to the transient analysis at the steady state condition without applying a forcing function to the blade or disk by applying the modal velocity vectors derived from the second target amplitude of vibration suddenly to all nodes of the numerical model of the blade and disk assembly while maintaining the steady state condition. Performance of the same transient analysis at different target amplitudes of vibration enables the processors to identify a step change in behavior of the connection resulting from a change from the first target amplitude of vibration to the second target amplitude of vibration. The processors may also be configured to introduce the same perturbation to the transient analysis at the steady state condition while changing a modeled degree of flexibility at the connection between the blade and disk. The perturbation may again be introduced without applying a forcing function to the blade or disk by applying the modal velocity vectors derived from the first target amplitude of vibration suddenly to all nodes of the numerical model of the blade and disk assembly while maintaining the steady state condition. This feature of processors configured in accordance with this disclosure enables the processors to identify a step change in behavior of the connection resulting from a change in the degree of flexibility of the connection between two different sets of actual operating conditions for the particular turbomachine.

Figure 7:
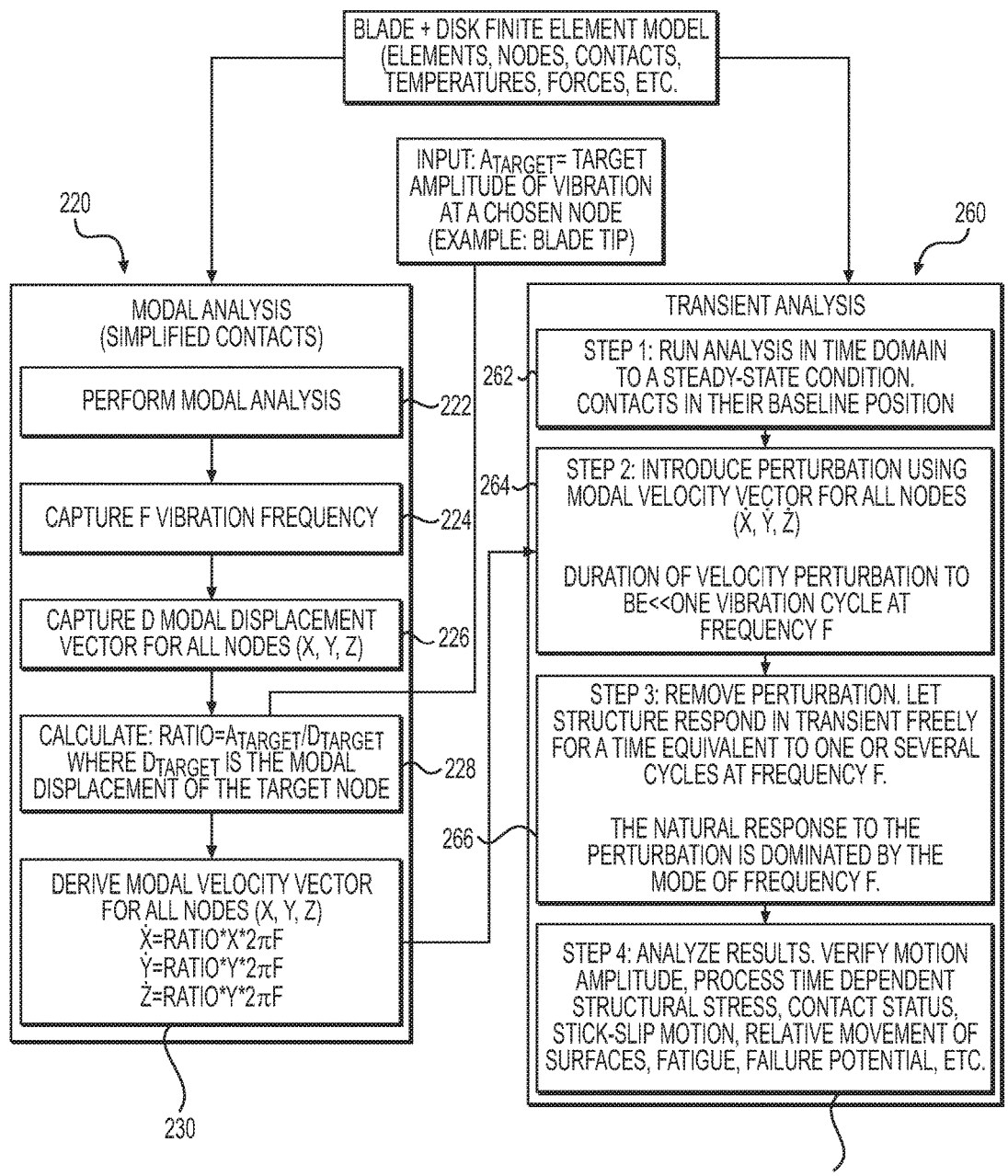
FIG. 7 is a flow chart illustrating the steps of a modal analysis and transient analysis performed in accordance with an exemplary disclosed embodiment.

An exemplary method that may be performed by one or more processors in accordance with this disclosure is shown in FIG. 7, and will be described in detail in the following section.

INDUSTRIAL APPLICABILITY

The system and methods for determining stresses at the connection between a blade and disk as set forth in this disclosure avoid problems associated with traditional transient analysis of blade and disk assemblies. As described above, the disclosed system and methods differ from the classical approach to transient analysis of applying a forcing function to a model of a blade and disk assembly, and then simulating many cycles until the vibration putatively reaches a steady-state regime. This traditional method of performing transient analysis is extremely computer intensive, and the required forcing function to be applied to the blade is also typically unknown. Furthermore, the non-linear nature of behavior at the connection between the blade and the disk may introduce unintended frequency content into the response, preventing the emergence of a steady-state condition and complicating any interpretation of the results of the transient analysis.

FIG. 7 illustrates an exemplary method of analyzing a blade and disk assembly in accordance with various implementations of this disclosure that greatly reduces the computing resources required to perform a transient analysis of the blade and disk assembly with a realistic modeling of the connection between the blade and disk. The actual root connection between a blade and disk often exhibits non-linear characteristics and various degrees of flexibility that introduce errors into traditional transient analysis, or make it difficult to determine actual stresses and other characteristics at the connection using traditional transient analysis.

As shown in FIG. 7, the system and methods of the present disclosure may combine the results of a modal analysis of a blade and disk assembly using simplified contacts between the blade and disk with a transient analysis in the time domain that enables determination of accurate results for a realistic model of an actual connection between the blade and disk. A finite element model (FEM) of a particular blade and disk assembly that may be used in both the modal analysis 220 and in the transient analysis 260 may consist of a plurality of elements, nodes, contacts, temperatures, forces, and other characteristics of the blade and disk assembly being analyzed.

As discussed above, a target vibration frequency F at which a target amplitude of vibration $A_{TARGET}$ has been measured at a target node on the blade and disk assembly of the turbine engine or other turbomachine during operation may have been previously determined during laboratory tests on an engine or while operating the engine on a test stand that is part of a Non-Intrusive Stress Measurement System (NSMS). The target node may be any point on the blade and disk assembly, such as at the blade tip. At Step 222, the modal analysis is begun with an assumption of simplified contacts between the blade and disk, such as a rigidly attached connection that behaves in a linear fashion under vibration.

At Step 224 of the modal analysis the target vibration frequency F may be captured. At Step 226, the modal displacement vectors D may be captured for all nodes (X, Y, Z—in a cartesian coordinate system). The modal displacement vectors in a cartesian coordinate system provide a measure of how far each node has moved in the X, Y, and Z directions as a result of an application of the target vibration frequency F to the disk and blade assembly. At Step 228, the previously determined target amplitude of vibration $A_{TARGET}$ at a target node may be input in order to calculate a ratio equal to $A_{TARGET}/D_{TARGET}$, where $D_{TARGET}$ is the modal displacement of the target node. Finally, Step 230 of the modal analysis may include deriving modal velocity vectors for all nodes of the blade and disk assembly model in X, Y, and Z directions. The X direction velocity vector ($\dot{X}$) equals the ratio $A_{TARGET}/D_{TARGET}$ times the modal displacement in the X direction times $2\pi F$, where F equals the target vibration frequency. The Y and Z direction modal velocity vectors ($\dot{Y}$, $\dot{Z}$) may be similarly calculated.

The transient analysis 260 may then begin with Step 262, in which the transient analysis is run in a time domain to a steady-state condition where the contacts between the blade and the disk are in their baseline position, such as illustrated in the graph of FIG. 6. At Step 264 of the transient analysis, the modal velocity vectors in the X, Y, and Z directions derived at Step 230 of the modal analysis may be introduced as a perturbation to all nodes of the blade and disk assembly model. The introduction of the perturbation at Step 264 in the form of modal velocity vectors may be applied only briefly, with the duration of the velocity perturbation being significantly less than one complete vibration cycle at the target vibration frequency F.

At Step 266 of the transient analysis, the perturbation may be removed, allowing the structure to respond in transient freely for a time equivalent to one or several vibration cycles at the target vibration frequency F. Since the perturbation introduced at Step 264 was consistent with a given modal shape, the natural response of the blade and disk assembly to the perturbation will be dominated by the mode of the target vibration frequency F. At Step 268, the results of the transient analysis and application of a perturbation may be analyzed. The analysis may include one or more of verifying the actual target amplitude of vibration, processing time dependent structural stresses, evaluating the status of the contacts at the connection between the blade and disk, evaluating any stick-slip motion that may occur at the connection, evaluating relative movement of the surfaces, analyzing potential fatigue at the connection or elsewhere on the blade/disk assembly resulting from the relative movement of the blade and disk, and evaluating the potential for failure as a result of the fatigue or other observed characteristics.

It will be apparent to those skilled in the art that various modifications and variations can be made to the modeling method of the present disclosure without departing from the scope of the disclosure. Other embodiments will be apparent to those skilled in the art from consideration of the specification and practice of the embodiments disclosed herein. It is intended that the specification and examples be considered as exemplary only, with a true scope of the disclosure being indicated by the following claims.

What is claimed is:

1. A computer-implemented method for determining stresses at the connection between a blade and a disk in a blade and disk assembly of a turbomachine, the method comprising:
    measuring a target amplitude of vibration at a target vibration frequency for a target node on the blade and disk assembly while operating the turbomachine;
    performing a modal analysis on the blade and disk assembly by executing computer-executable instructions retrieved from a non-transitory computer-readable medium by one or more processors, wherein the modal analysis includes creating a finite element model of the blade and disk assembly made up of a plurality of nodes corresponding to points on the blade and disk assembly and characterized by a simplifying assumption of a rigidly attached connection between the blade and disk;
    deriving modal velocity vectors, using the one or more processors, from the target amplitude of vibration and target vibration frequency at the target node;
    performing a transient analysis in a time domain on a numerical model of the blade and disk assembly, using the one or more processors, wherein the transient analysis includes modeling the connection between the blade and disk such that the connection is characterized by a first degree of flexibility representative of a first set of actual operating conditions at the connection, and running the transient analysis to an initial steady state condition; and
    introducing a perturbation to the transient analysis at the initial steady state condition, using the one or more processors, by applying the modal velocity vectors suddenly to a plurality of nodes of the numerical model of the blade and disk assembly while maintaining the initial steady state condition.

2. The computer-implemented method of claim 1, further including removing the perturbation while maintaining the initial steady state condition and analyzing the transient response of the numerical model of the blade and disk assembly for a plurality of vibration cycles at the target vibration frequency after removal of the perturbation.

3. The computer-implemented method of claim 2, further including analyzing vibration results after removal of the perturbation in order to at least one of verify amplitude at the target vibration frequency, determine time dependent structural stress at the target node, determine the status of the connection between the blade and disk, determine stick-slip motion at the connection, determine relative motion between the blade and disk at the connection, determine fatigue at the connection, and determine a failure potential for the connection.

4. The computer-implemented method of claim 1, further including performing an independent modal analysis and an independent transient analysis for each one of a different modal shape of the blade and disk assembly, for each one of a different target vibration frequency, for each one of a different target amplitude of vibration, and for each different degree of flexibility characterizing the connection and representative of a different set of actual operating conditions at the connection.

5. The computer-implemented method of claim 1, wherein applying the modal velocity vectors suddenly to a plurality of nodes moves the transient analysis from the initial steady state condition to an actual speed of the nodes at a point of maximum amplitude for the nodes in a period of time less than 10 percent of the time for one cycle of the target vibration frequency.

6. The computer-implemented method of claim 1, wherein the target vibration frequency at which the target amplitude of vibration has been measured at the target node on the blade and disk assembly of the turbomachine during operation is a result of a combination of centrifugal loads and gas loads on the blade and disk assembly during operation of the turbomachine.

7. The computer-implemented method of claim 1, wherein introducing the perturbation to the transient analysis in the initial steady state condition results in a simulation of the target amplitude of vibration without recreating amplitudes of vibration in between the initial steady state condition and the target amplitude that are not of interest.

8. The computer-implemented method of claim 7, wherein the numerical model of the transient analysis demonstrates a free oscillation around the initial steady state condition immediately after removal of the perturbation, wherein the free oscillation is characterized by the target vibration frequency and the target amplitude of vibration and is imposed on the connection between the blade and disk including the modeled degree of flexibility.

9. The computer-implemented method of claim 1, wherein the initial steady state condition of the transient analysis includes an assumption of at least one of speed of the blade and disk assembly, a degree of flexibility characterizing the connection and representative of a particular set of operating conditions at the connection, temperature at the connection, pressure of gases flowing past the blade and disk assembly, a physical characteristic of the gases, and a physical configuration and relative dimensions of portions of the blade and disk at the connection therebetween.

10. A method of modeling the connection between a blade and disk assembly at a root connection between the blade and disk, the method comprising:
   measuring a first target amplitude of vibration at a first target vibration frequency for a target node at the root connection between the blade and disk while operating a turbomachine comprising the blade and disk assembly;
   performing a modal analysis on the blade and disk assembly, by executing computer-executable instructions retrieved from a non-transitory computer-readable medium by one or more processors, wherein the modal analysis includes creating a finite element model of the blade and disk assembly assuming a rigidly attached connection between the blade and disk;
   deriving modal velocity vectors, using the one or more processors, from the first target amplitude at the target node;
   performing a transient analysis in a time domain on a numerical model of the blade and disk assembly, using the one or more processors, wherein the transient analysis includes modeling the connection between the blade and disk such that the connection is characterized by a degree of flexibility representative of a first set of actual operating conditions for the particular turbomachine at the connection, and running the transient analysis to an initial steady state condition; and
   introducing a perturbation to the transient analysis at the steady state condition, using the one or more processors, without applying a forcing function to the blade or disk by applying the modal velocity vectors from the first target amplitude of vibration suddenly to a plurality of nodes of the numerical model of the blade and disk assembly while maintaining the steady state condition.

11. The method of claim 10, further including removing the perturbation while maintaining the steady state condition and analyzing the transient response of the numerical model of the blade and disk assembly for a plurality of vibration cycles at the first target vibration frequency after removal of the perturbation.

12. The method of claim 11, further including:
   selecting a second target vibration frequency at which a second target amplitude of vibration different from the first amplitude of vibration has been one of measured or estimated for the target node on the blade and disk assembly of the turbomachine during operation;
   deriving modal velocity vectors from the second target amplitude at the target node;
   performing a transient analysis in a time domain on a numerical model of the blade and disk assembly, wherein the transient analysis includes modeling the connection between the blade and disk such that the connection is characterized by a degree of flexibility representative of the first set of actual operating conditions for the turbomachine at the connection, and running the transient analysis to an initial steady state condition; and
   introducing a perturbation to the transient analysis at the steady state condition without applying a forcing function to the blade or disk by applying the modal velocity vectors derived from the second target amplitude of vibration suddenly to all nodes of the numerical model of the blade and disk assembly while maintaining the steady state condition to identify a step change in behavior of the connection resulting from a change from the first target amplitude of vibration to the second target amplitude of vibration.

13. The method of claim 11, further including:
   selecting the first target vibration frequency at which the first target amplitude of vibration has been measured at the target node on the blade and disk assembly of the turbomachine during operation;
   deriving modal velocity vectors from the first target amplitude at the target node;
   performing a transient analysis in a time domain on a numerical model of the blade and disk assembly, wherein the transient analysis includes modeling the connection between the blade and disk such that the connection is characterized by a degree of flexibility representative of a second set of actual operating conditions for the particular turbomachine at the connection different from the first set of actual operating conditions, and running the transient analysis only to an initial steady state condition; and
   introducing a perturbation to the transient analysis at the steady state condition without applying a forcing function to the blade or disk by applying the modal velocity vectors derived from the first target amplitude of vibration suddenly to all nodes of the numerical model of the blade and disk assembly while maintaining the steady state condition to identify a step change in behavior of the connection resulting from a change in the degree of flexibility of the connection between the first and second sets of actual operating conditions for the turbomachine.

14. The method of claim 11, further including analyzing vibration results after removal of the perturbation in order to at least one of verify amplitude at the target vibration frequency, process time dependent structural stress at one or more target nodes, determine the status of the connection between the blade and disk, determine stick-slip motion at the connection, determine relative motion between the blade and disk at the connection, determine fatigue at the connection, and determine a failure potential for the connection.

15. The method of claim 10, wherein applying the modal velocity vectors suddenly to a plurality of nodes moves the transient analysis from the initial steady state condition to an actual speed of the nodes at a point of maximum amplitude for the nodes in a period of time less than 10 percent of the time for one cycle of the target vibration frequency.

16. The method of claim 10, wherein introducing the perturbation to the transient analysis in a steady state condition results in a simulation of the target amplitude of vibration without recreating amplitudes of vibration in between the initial steady state condition and the target amplitude that are not of interest.

17. The method of claim 16, wherein the numerical model of the transient analysis demonstrates a free oscillation around the steady state condition immediately after removal of the perturbation, and wherein the free oscillation has the target amplitude of vibration and is imposed on the connection between the blade and disk including the modeled degree of flexibility.

18. A non-transitory computer-readable medium for use in determining at least one of behavior and characteristics of a root connection between a blade and a disk in a blade and disk assembly of a turbomachine, the computer-readable medium comprising computer-executable instructions that, when executed by one or more computer processors, perform a method comprising:

receiving at one of the one or more computer processors a first target amplitude of vibration at a first target vibration frequency measured at a target node at the root connection between the blade and disk while operating the turbomachine comprising the blade and disk assembly;

performing a modal analysis on the blade and disk assembly, wherein the modal analysis includes creating a finite element model of the blade and disk assembly made up of a plurality of nodes corresponding to points on the blade and disk assembly and characterized by a simplifying assumption of a rigidly attached connection between the blade and disk;

deriving modal velocity vectors from the target amplitude at the target node;

performing a transient analysis in a time domain on a numerical model of the blade and disk assembly, wherein the transient analysis includes modeling the connection between the blade and disk such that the connection is characterized by a first degree of flexibility representative of a first set of actual operating conditions at the connection, and running the transient analysis to an initial steady state condition; and introducing a perturbation to the transient analysis at the initial steady state condition by applying the modal velocity vectors suddenly to a plurality of nodes of the numerical model of the blade and disk assembly while maintaining the initial steady state condition.

19. The non-transitory computer-readable medium of claim 18, wherein the method further includes:

removing the perturbation while maintaining the initial steady state condition; and analyzing the transient response of the numerical model of the blade and disk assembly for a plurality of vibration cycles at the target vibration frequency after removal of the perturbation.

20. The non-transitory computer-readable medium of claim 18, wherein the method further includes:

performing an independent modal analysis and an independent transient analysis for at least one of:
  a different modal shape of the blade and disk assembly;
  a different target vibration frequency;
  a different target amplitude of vibration; and
  a different degree of flexibility characterizing the connection and representative of a different set of actual operating conditions at the connection.

* * * * *